(12) United States Patent
Komatsu

(10) Patent No.: US 12,708,035 B2
(45) Date of Patent: Aug. 11, 2026

(54) SEMICONDUCTOR MODULE, METHOD OF MANUFACTURING SEMICONDUCTOR MODULE, AND CASE UNIT

(71) Applicant: FUJI ELECTRIC CO., LTD., Kawasaki (JP)

(72) Inventor: Kousuke Komatsu, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 795 days.

(21) Appl. No.: 17/974,087

(22) Filed: Oct. 26, 2022

(65) Prior Publication Data

US 2023/0187293 A1 Jun. 15, 2023

(30) Foreign Application Priority Data

Dec. 14, 2021 (JP) ................................ 2021-202755

(51) Int. Cl.

| | |
|---|---|
| ***H10P 50/00*** | (2026.01) |
| ***H10B 12/00*** | (2023.01) |
| ***H10P 14/40*** | (2026.01) |
| ***H10P 32/30*** | (2026.01) |
| ***H10W 70/65*** | (2026.01) |
| ***H10W 72/50*** | (2026.01) |
| ***H10W 74/10*** | (2026.01) |

(Continued)

(52) U.S. Cl.

CPC ........... *H10W 76/60* (2026.01); *H10W 70/65* (2026.01); *H10W 72/50* (2026.01); *H10W 74/111* (2026.01); *H10W 74/40* (2026.01); *H10W 76/12* (2026.01); *H10W 72/07554* (2026.01)

(58) Field of Classification Search

None

See application file for complete search history.

(56) References Cited

U.S. PATENT DOCUMENTS

2003/0087448 A1* 5/2003 Abe ...................... G01F 15/006 436/124

2005/0115328 A1 6/2005 Hayashi et al.

(Continued)

FOREIGN PATENT DOCUMENTS

| | | |
|---|---|---|
| JP | 2006138841 A | 6/2006 |
| JP | 2008235651 A | 10/2008 |

(Continued)

*Primary Examiner* — Dale E Page
*Assistant Examiner* — Michael Anguiano

(57) ABSTRACT

A semiconductor module includes: a semiconductor element; a laminated substrate including a circuit substrate on which the semiconductor element is mounted; a case including a plurality of terminal holes, the case housing the semiconductor element; a plurality of external terminals, each external terminal being inserted into one of two or more terminal holes among the plurality of terminal holes, the plurality of external terminals being electrically connected to the semiconductor element; and a spacer interposed between the laminated substrate and the case. The case and the spacer are bonded to each other by an adhesive. The case includes, for each two adjacent terminal holes among the plurality of terminal holes, a partition between the two adjacent terminal holes. A distance between the first bonding surface and the partition is greater than a thickness of each external terminal.

10 Claims, 10 Drawing Sheets

(51) Int. Cl.

| | |
|---|---|
| ***H10W 74/40*** | (2026.01) |
| ***H10W 76/12*** | (2026.01) |
| ***H10W 76/60*** | (2026.01) |
| *H10W 72/00* | (2026.01) |

(56) References Cited

U.S. PATENT DOCUMENTS

| | | | | |
|---|---|---|---|---|
| 2006/0202323 | A1* | 9/2006 | Shinohara | H10W 42/121 257/E23.101 |
| 2006/0220190 | A1* | 10/2006 | Inui | H01L 23/49575 257/666 |
| 2008/0217760 | A1* | 9/2008 | Yoshihara | H10W 70/479 438/122 |
| 2009/0212411 | A1* | 8/2009 | Matsumoto | H10W 76/15 438/106 |
| 2010/0032066 | A1* | 2/2010 | Nakao | B60C 13/00 235/492 |
| 2014/0159224 | A1* | 6/2014 | Okada | H01L 25/0655 257/690 |
| 2017/0141022 | A1* | 5/2017 | Maruyama | H10W 70/65 |
| 2020/0395278 | A1* | 12/2020 | Harada | H10W 76/15 |
| 2023/0320013 | A1* | 10/2023 | Shigyo | H05K 5/0252 361/679.01 |

FOREIGN PATENT DOCUMENTS

| | | | |
|---|---|---|---|
| JP | 2017092388 | A | 5/2017 |
| WO | 03062779 | A1 | 7/2003 |

* cited by examiner 10
60
LC
61
30
20
80
W
PA
62
G1
60a
50
55
P0
51
LH
P1
d
t
d
L
P2
70
G2
70b
40
70a
B1
B2
Z1
Z
Y2
Y1
X1
Y
Z2

30
20
80
PA
G1
LC
10
50
55
P0
51
LH
P1
L
P2
70
G2
70b
40
70a
B1
B2
Z1
Z
Y2
Y1
X1
Y
Z2

60
51a
LC
LC
LC
51_1
51_2
51_3
10
61
61a
61b
50
P0
51b
LH
55
55
G1 G1
P1
P1
X1
X2
Y1
X
L
t
B1
50a
62
P2
70
B2
40
56
70a
56
70b
Z1
Z
Z2

SEMICONDUCTOR MODULE, METHOD OF MANUFACTURING SEMICONDUCTOR MODULE, AND CASE UNIT

CROSS REFERENCE TO RELATED APPLICATION

This application is based on, and claims priority from, Japanese Patent Application No. 2021-202755, filed Dec. 14, 2021, the entire contents of which are incorporated herein by reference.

BACKGROUND

Technical Field

This disclosure relates to a semiconductor module, to a method of manufacturing a semiconductor module, and to a case unit.

Related Art

A semiconductor module, such as a power semiconductor module, generally includes a semiconductor element, a laminated substrate including a circuit substrate on which the semiconductor element is mounted, a case for housing the semiconductor element, and a plurality of external terminals that is electrically connected to the semiconductor element. For example, as described in Japanese Patent Application Laid-Open Publication No. 2017-92388, the case includes a plurality of terminal holes that penetrates the case. Each of the plurality of external terminals is inserted into one of the plurality of terminal holes, and each of the plurality of external terminals includes a portion that protrudes from an outer wall surface of the case.

In a configuration described in Japanese Patent Application Laid-Open Publication No. 2017-92388, the laminated substrate includes, in addition to the circuit substrate, a base for radiating heat. In the described configuration, a terminal pressing frame is disposed between the case and the base. The terminal pressing frame presses the external terminals toward the case. The terminal pressing frame is bonded to the case and the base by an adhesive. The configuration described in Japanese Patent Application Laid-Open Publication No. 2017-92388 includes a gap between the terminal pressing frame and the external terminals in addition to a gap between the terminal pressing frame and the case. The adhesive applied to a bottom surface of the terminal pressing frame enters each of the gaps. The case includes a plurality of terminal holes. The number and position of the terminal holes are configured so that the case can be used to accommodate different types of semiconductor modules. As a result, one or more of the terminal holes may not have an external terminal inserted therein.

A need has existed for a semiconductor module that can be used for a long period of time even in a corrosive gas atmosphere.

In the configuration described in Japanese Patent Application Laid-Open Publication No. 2017-92388, when the case and the terminal pressing frame are bonded to each other by the adhesive, spread of the adhesive is inhibited by a partition interposed between two adjacent terminal holes. Depending on where the adhesive is applied, an amount of the adhesive that reaches a terminal hole may vary. Consequently, it is difficult to uniformly seal the terminal holes with the applied adhesive, particularly those terminal holes into which no external terminal is inserted. Consequently, when the semiconductor module described in Japanese Patent Application Laid-Open Publication No. 2017-92388 is used in a corrosive gas atmosphere, the corrosive gas may enter the case through one or more of the terminal holes and damage the semiconductor module.

SUMMARY

In view of the circumstances described above, an object of one aspect according to the present disclosure is to reduce damage to a semiconductor module used in a corrosive gas atmosphere.

To solve the above problem, a semiconductor module according to an aspect of the present disclosure includes: a semiconductor element; a laminated substrate including a circuit substrate on which the semiconductor element is mounted; a case including a plurality of terminal holes, the case housing the semiconductor element; a plurality of external terminals, each external terminal being inserted into one of two or more terminal holes among the plurality of terminal holes, each of the two or more terminal holes being a terminal hole into which one of the plurality of external terminals is inserted, the plurality of external terminals being electrically connected to the semiconductor element; and a spacer interposed between the laminated substrate and the case. The case and the spacer are bonded to each other by an adhesive. Each external terminal includes a first bonding surface bonded to the spacer by the adhesive. The case includes, for each two adjacent terminal holes among the plurality of terminal holes, a partition between the two adjacent terminal holes. A distance between the first bonding surface and a partition corresponding to the two or more terminal holes is greater than a thickness of each external terminal. A distance between the spacer and a partition corresponding to a terminal hole other than the two or more terminal holes is equal to or greater than a distance between the spacer and the partition corresponding to the two or more terminal holes, the terminal hole other than the two or more terminal holes being included in the plurality of terminal holes.

A method of manufacturing a semiconductor module according to another aspect of the present disclosure includes: preparing a case including a plurality of terminal holes; inserting each external terminal of a plurality of external terminals into one of two or more terminal holes among the plurality of terminal holes such that each of the two or more terminal holes is a terminal hole into which one of the plurality of external terminals is inserted; and bonding the case and a spacer to each other with an adhesive. Each external terminal includes a first bonding surface that is bonded to the spacer by the adhesive. The case includes, for each two adjacent terminal holes among the plurality of terminal holes, a partition between the two adjacent terminal holes. A distance between the first bonding surface and the partition is greater than a thickness of each external terminal. The bonding the case and the spacer includes sealing each terminal hole with the adhesive.

A case unit according to a yet another aspect of the present disclosure includes: a case including a plurality of terminal holes; a plurality of external terminals, each external terminal being inserted into one of two or more terminal holes among the plurality of terminal holes, each of the two or more terminal holes being a terminal hole into which one of the plurality of external terminals is inserted; and a spacer bonded to the case by an adhesive. Each external terminal includes a first bonding surface bonded to the spacer by the adhesive. The case includes, for each two adjacent terminal holes among the plurality of terminal holes, a partition between the two adjacent terminal holes. A distance between the first bonding surface and the partition is greater than a thickness of each external terminal. Each terminal hole is sealed by the adhesive.

DESCRIPTION OF EMBODIMENTS

Figure 1:
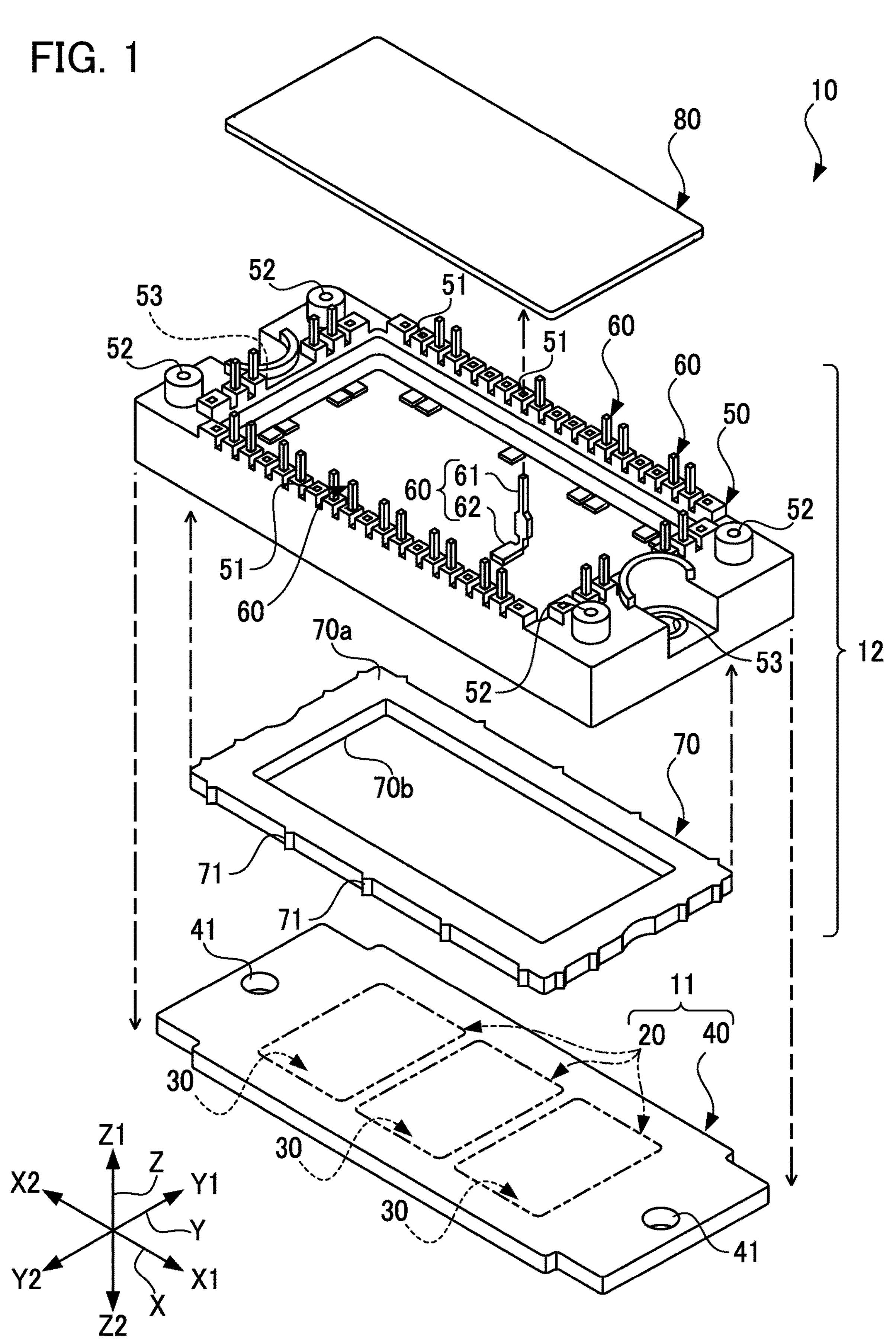
FIG. 1 is an exploded perspective view showing a semiconductor module according to a first embodiment.

Embodiments according to the present disclosure will be described with reference to the drawings. In the drawings, dimensions and a scale of elements may differ from those of actual products, and some elements may be shown schematically for ease of understanding. The scope of the present disclosure is not limited to the embodiments described below unless the following explanation includes a description that specifically limits the scope of the present disclosure.

1. First Embodiment

1-1. Overall Configuration of Semiconductor Module

FIG. 1 is an exploded perspective view showing a semiconductor module 10 according to a first embodiment. The semiconductor module 10 is a power module such as an insulated gate bipolar transistor (IGBT) module, etc. The semiconductor module 10 is used, for example, to power control a device such as an inverter or a rectifier, etc., that is mounted on an apparatus such as a railway vehicle, an automobile, or a household electrical machine, etc.

As shown in FIG. 1, the semiconductor module 10 includes a plurality of semiconductor elements 30, a circuit substrate 20, a base 40, a case 50, a plurality of external terminals 60, a spacer 70, and a lid 80. In FIG. 1, the semiconductor element 30 is not shown, and an outer shape of the circuit substrate 20 is depicted by a thin long-dash, double short-dash line. The circuit substrate 20 and the base 40 are included in a laminated substrate 11. The laminated substrate 11 is a plate-shaped laminate including at least the circuit substrate 20. In this embodiment, the laminated substrate 11 includes the base 40 in addition to the circuit substrate 20. Included in a case unit 12 are the case 50, the plurality of external terminals 60, and the spacer 70. The case unit 12 is an assembly that is assembled from the case 50, the plurality of external terminals 60, and the spacer 70.

First, an outline of each element of the semiconductor module 10 will be described with reference to FIG. 1. For convenience, in the following description reference is made, as appropriate, to an X-axis, a Y-axis and a Z-axis that are perpendicular to each other. The Z-axis is an axis parallel to a direction of thickness of the semiconductor module 10. In the following description, a direction along the X-axis is referred to as an X1 direction, and a direction opposite to the X1 direction is referred to as an X2 direction. A direction along the Y-axis is referred to as a Y1 direction, and a direction opposite to the Y1 direction is referred to as a Y2 direction. A direction along the Z-axis is referred to as a Z1 direction, and a direction opposite to the Z1 direction is referred to as a Z2 direction. The relationship between these directions and the vertical direction is not particularly limited, and may be freely selected. In the following description, a view in a direction along the Z-axis may be referred to as a "plan view."

The circuit substrate 20 is a board on which the plurality of semiconductor elements 30 is mounted. The circuit substrate 20 constitutes a circuit together with the plurality of semiconductor elements 30. For example, the circuit substrate 20 is a substrate such as a direct copper bonding (DCB) substrate or a direct bonded aluminum (DBA) substrate, etc. Although not shown, the circuit substrate 20 includes an insulating substrate and two conductor layers provided on both surfaces of the insulating substrate. The insulating substrate is made of, for example, a ceramic material such as an aluminum nitride material, an aluminum oxide material, or a silicon nitride material, etc. Each of the two conductor layers is made of, for example, a metal such as a copper material or an aluminum material, etc. The plurality of semiconductor elements 30 is coupled to one conductor layer of the two conductor layers by a solder material, etc. The base 40 is coupled to the other conductor layer of the two conductor layers by a solder material, etc.

In the example shown in FIG. 1, a direction of thickness of the circuit substrate 20 is the direction along the Z-axis. Each of the plurality of semiconductor elements 30 is coupled to a surface of the circuit substrate 20 facing in the Z1 direction by use of a conductive bonding material such as a solder material, etc. The base 40 is coupled to a surface of the circuit substrate 20 facing in the Z2 direction by use of a conductive bonding material such as a solder material, etc.

At least one of the plurality of semiconductor elements 30 mounted on the circuit substrate 20 is a power semiconductor chip such as an IGBT, etc. In addition to the power semiconductor chip, a control chip for controlling an operation of the power semiconductor chip may be mounted on the circuit substrate 20 as a semiconductor element 30, and an element such as a freewheeling diode (FWD) that allows a load current to return may be mounted on the circuit substrate 20 as a semiconductor element 30.

The base 40 is a plate-shaped member that radiates heat. For example, the base 40 is a metal plate made of a copper material, a copper alloy, an aluminum material, or an aluminum alloy. The base 40 is thermally conductive and radiates heat conducted from the semiconductor elements 30. The base 40 is also electrically conductive. The base 40 is electrically connected to a reference potential line such as a ground potential line, etc.

In the example shown in FIG. 1, a direction of thickness of the base 40 is the direction along the Z-axis. The base 40 is shaped to have a pair of long sides extending in the direction along the X-axis as viewed in the direction along the Z-axis, and a pair of short sides extending in the direction along the Y-axis as viewed in the direction along the Z-axis. The base 40 is equipped with mounting holes 41 in a vicinity of each short side. Each of the mounting holes 41 is a through hole that is used to screw a radiating member such as a radiating fin (not shown) to the base 40, for example. The shape of the base 40 in plan view and the number of bases 40 are not limited to the example shown in FIG. 1. The shape of the base 40 in plan view and the number of bases 40 may be freely selected.

The case 50 is a frame-shaped member that houses the plurality of semiconductor elements 30 mounted on the circuit substrate 20. The case 50 is substantially an insulator, and is made of a resin material such as a polyphenylene sulfide (PPS) material or a polybutylene terephthalate (PBT) material, etc. The resin material may include an inorganic filler such as an alumina material or a silica material, etc., with a view to improving a mechanical strength or a thermal conductivity of the case 50.

The case 50 includes a plurality of terminal holes 51 arranged along a circumferential direction of the case 50. Each terminal hole 51 is a hole that penetrates the case 50. In the example shown in FIG. 1, each terminal hole 51 extends in the direction along the Z-axis.

In the example shown in FIG. 1, a direction of thickness of the case 50 is the direction along the Z-axis. Externally, the case 50 is shaped to have a pair of long sides extending in the direction along the X-axis as viewed in the direction along the Z-axis, and a pair of short sides extending in the direction along the Y-axis as viewed in the direction along the Z-axis. The plurality of terminal holes 51 included in the case 50 is divided into a plurality of terminal holes 51 arranged along each long side and a plurality of terminal holes 51 arranged along each short side.

For each of two or more terminal holes 51 from among the plurality of terminal holes 51 included in the case 50, an external terminal 60 is inserted into the terminal hole 51. Therefore, the number of terminal holes 51 included in the case 50 is greater than or equal to the number of external terminals 60. The case 50, in which the number of terminal holes 51 is greater than the number of external terminals 60, is applicable for use with various semiconductor modules that have different terminal positions. For use with different terminal positions, the number of terminal holes 51 included in the case 50 may be predetermined based on a number and arrangement of external terminals 60 of a semiconductor module. The number of terminal holes 51 and the arrangement of the terminal holes 51 are not limited to the example shown in FIG. 1, and the number of terminal holes 51 and the arrangement of the terminal holes 51 may each be freely selected.

Each of the plurality of external terminals 60 is a terminal that electrically connects the semiconductor elements 30 to a substrate (not shown) on which the semiconductor module 10 is mounted. The plurality of external terminals 60 is made of, for example, a metal such as a copper material, a copper alloy, an aluminum material, an aluminum alloy, or an iron alloy, etc.

Among the plurality of external terminals 60 of the semiconductor module 10, each of two or more external terminals 60 is a terminal through which a main current flows, and each of other two or more external terminals 60 is a control terminal for controlling an operation of the semiconductor element 30.

In the example shown in FIG. 1, the external terminal 60 is formed of a metal plate that is configured to have an L-shape. The external terminal 60 includes a pin 61 and a leg 62.

The pin 61 is a bar-shaped portion of the external terminal 60 and is inserted into the terminal hole 51. The pin 61 extends in the direction along the Z-axis in the terminal hole 51. An end of the pin 61 in the Z1 direction protrudes from an outer wall surface of the case 50. Thus, the pin 61 includes a portion protruding from the outer wall surface of the case 50. The protruding portion is connected to the substrate (not shown) on which the semiconductor module 10 is mounted. An end of the pin 61 in the Z2 direction is connected to the leg 62. The shape of the pin 61 is not limited to the example shown in FIG. 1. The shape of the pin 61 may be such that the tip of the pin 61 branches into two parts, for example.

The leg 62 is a plate-shaped portion of the external terminal 60. The plate-shaped portion of the external terminal 60 is arranged along a surface of the spacer 70 facing in the Z1 direction. The leg 62 extends from the end of the pin 61 in the Z2 direction toward the inside of the case 50. The leg 62 includes both a portion that is positioned between the case 50 and the spacer 70, and a portion that is exposed in a space within the case 50. One end of a wire such as a bonding wire (not shown) is coupled to the exposed portion. The other end of the wire is connected to the circuit substrate 20 or to the semiconductor element 30. By this connection, the external terminal 60 and the semiconductor element 30 are electrically connected to each other.

The spacer 70 is a frame-shaped member interposed between the base 40 and the case 50. The spacer 70 functions to press the plurality of external terminals 60 toward the case 50 and to ensure electrical insulation between each of the plurality of external terminals 60 and the base 40. The spacer 70 is substantially an insulator. For example, the spacer 70 is made of a resin material such as a PPS material or a PBT material, etc., as is the case 50. The resin material may include an inorganic filler such as an alumina material or a silica material, etc., with a view to improving a mechanical strength of the spacer 70. The material included in the spacer 70 is not limited to a resin material. For example, the material included in the spacer 70 may be a ceramic material.

In the example shown in FIG. 1, a direction of the thickness of the spacer 70 is the direction along the Z-axis. The surface of the spacer 70 facing in the Z1 direction includes a bonding surface 70*a*. The bonding surface 70*a* is bonded to the case 50 by an adhesive. Although not shown in FIG. 1, the adhesive is an adhesive B1 described below. On the other hand, a surface of the spacer 70 facing in the Z2 direction includes a bonding surface 70*b*. The bonding surface 70*b* is bonded to the base 40, which is a portion of the laminated substrate 11, by an adhesive. Although not shown in FIG. 1, the adhesive is an adhesive B2 described below. The bonding of the laminated substrate 11 and the spacer 70 to each other is not limited to bonding by an adhesive. For example, the laminated substrate 11 and the spacer 70 may be coupled to each other by screws. When the circuit substrate 20 is disposed over the entire area of the base 40 or when the base 40 is omitted, the bonding surface 70*b* of the spacer 70 may be bonded to the circuit substrate 20 by an adhesive.

In the example shown in FIG. 1, a plurality of protrusions 71 is provided on an outer peripheral surface of the spacer 70. The plurality of protrusions 71 is arranged in a circumferential direction of the spacer 70. Therefore, it is possible to fit the case 50 and the spacer 70 to each other such that the spacer 70 can be easily inserted inside the case 50. The number of protrusions 71, the positions of the protrusions 71, and the shapes of the protrusions 71 are not limited to the examples shown in FIG. 1, and may be freely selected. Furthermore, each of the plurality of protrusions 71 may be provided or omitted as needed.

The lid 80 is a plate-shaped member coupled to a surface of the case 50 facing in the Z1 direction. The lid 80 is made of a resin material such as a PPS material or a PBT material, etc., as is the case 50, for example. The lid 80 is bonded to the case 50 by an adhesive, etc., so as to seal a gap between the lid 80 and the case 50.

A space surrounded by the base 40, the case 50, and the lid 80 is filled with a potting material covering the semiconductor elements 30. Although not shown in FIG. 1, the potting material is a potting material PA described below. The potting material includes, for example, a silicone resin such as a silicone gel material, etc.

In the semiconductor module 10 described above, each of the plurality of terminal holes 51 is sealed by the adhesive bonding the case 50 and the spacer 70 to each other. Therefore, when the semiconductor module 10 is used in a corrosive gas atmosphere, it is possible to substantially prevent a corrosive gas from entering the case 50 through the terminal holes 51. The semiconductor module 10 has a configuration that enhances sealing of each terminal hole 51 by the adhesive used to bond the case 50 and the spacer 70 to each other. The configuration will be described in detail below.

1-2. Terminal Holes

Figure 2:
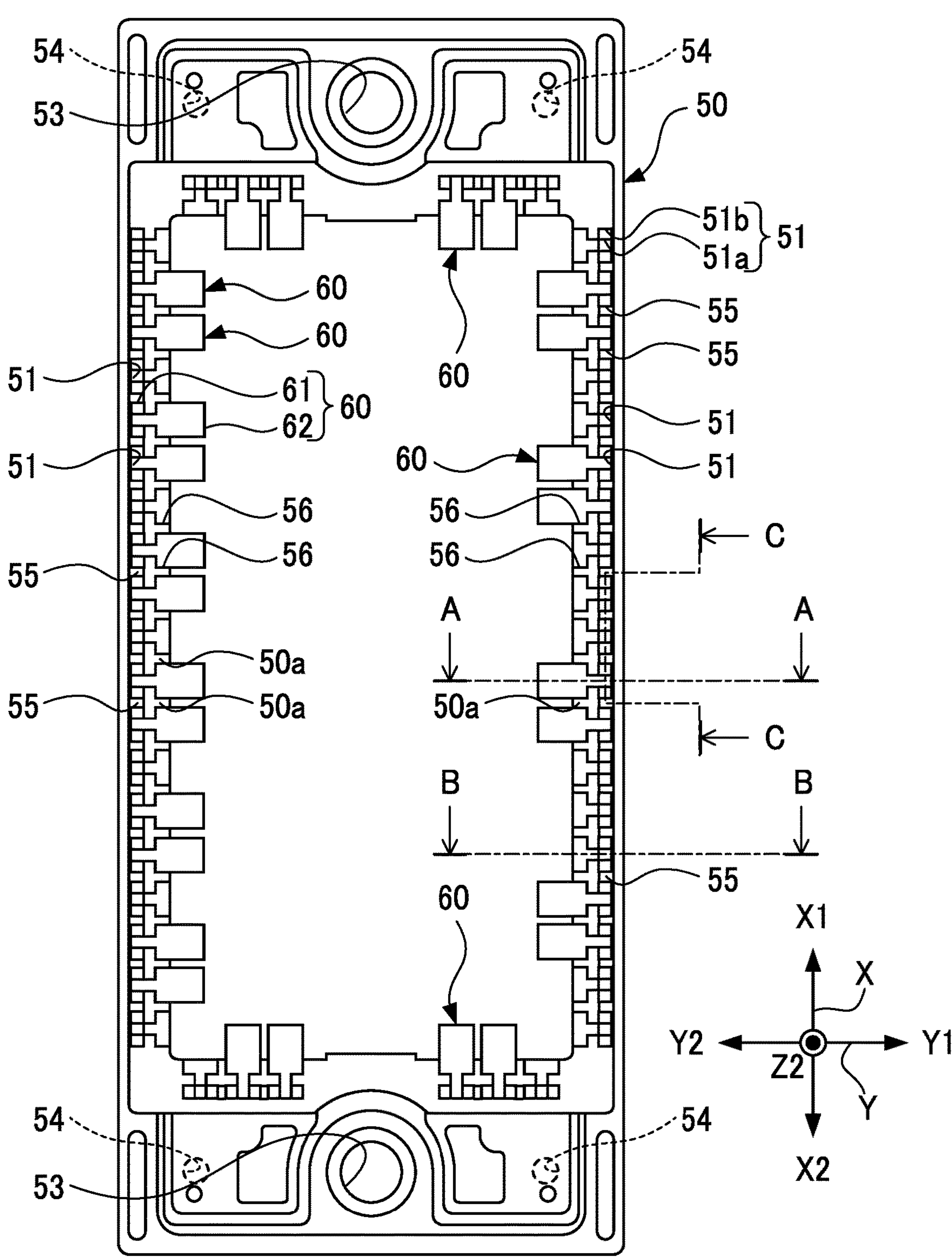
FIG. 2 is a bottom view showing a case.
Figures 3, 4:
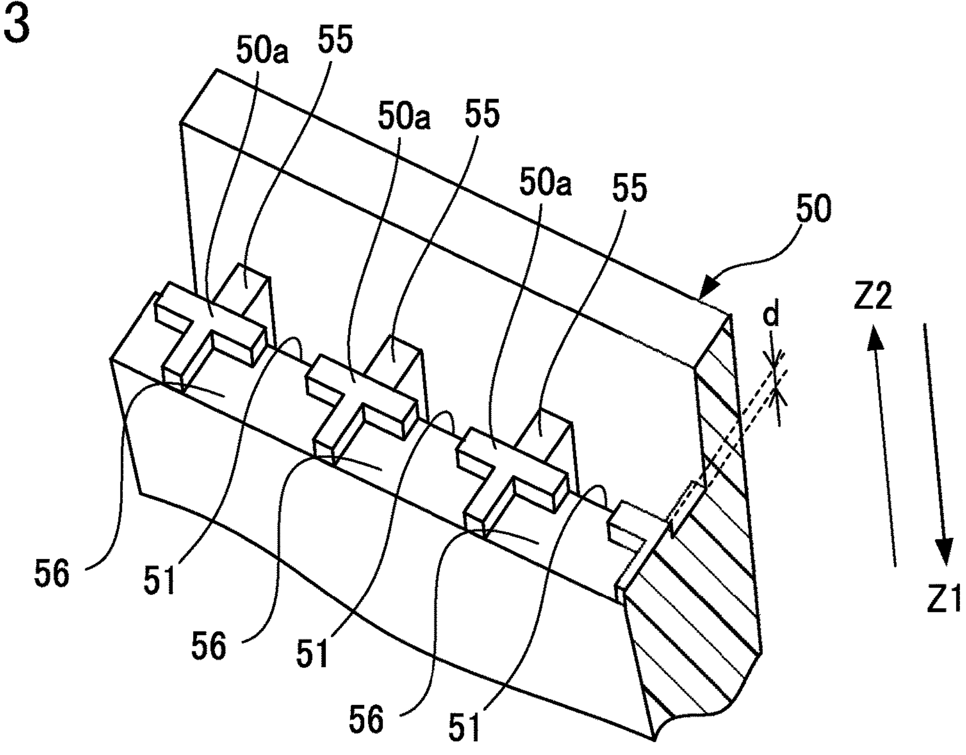
FIG. 3 is a perspective view showing a portion of the case.
FIG. 4 is a cross section showing the semiconductor module taken along line A-A in FIG. 2.

FIG. 2 is a bottom view showing the case 50, in other words, a diagram showing the case 50 equipped with the plurality of external terminals 60 as viewed in the Z1 direction. FIG. 3 is a perspective view showing a portion of the case 50. FIG. 3 is a diagram showing the case 50 as viewed in a direction slightly inclined to the Z1 direction for convenience of explanation of partitions 55. As shown in FIG. 2 and FIG. 3, the case 50 is equipped with a plurality of partitions 55. Each partition 55 separates two adjacent terminal holes 51.

In the example shown in FIG. 2 and FIG. 3, each terminal hole 51 has a shape that corresponds to the shape of the pin 61 of the external terminal 60. Specifically, each terminal hole 51 includes a first portion 51*a* and a second portion 51*b*. The first portion 51*a* opens to the surface of the case 50 facing in the Z1 direction. The second portion 51*b* is positioned apart from the first portion 51*a* in the Z2 direction. The second portion 51*b* opens to a surface of the case 50 facing in the Z2 direction.

The surface of the case 50 facing in the Z2 direction includes a plurality of bonding surfaces 50*a* and a plurality of recesses 56.

Each bonding surface 50*a* is a surface included in the surface of the case 50 facing in the Z2 direction. The surface of the case 50 facing in the Z2 direction is bonded to the bonding surface 70*a* of the spacer 70 by an adhesive B1. In other words, the bonding surface 50*a* is the closest surface to the bonding surface 70*a* of the spacer 70 among surfaces of the case 50 facing in the Z2 direction; and the bonding surface 50*a* faces the bonding surface 70*a* with the adhesive B1 disposed therebetween. In the example shown in FIG. 2, each bonding surface 50*a* has a T-shape in plan view. The shape of the bonding surface 50*a* in plan view is not limited to the example shown in FIG. 2, and may be freely selected.

The recesses 56 each extend from the bonding surface 50*a*, and in plan view each is positioned between two adjacent bonding surfaces 50*a*. The recesses 56 extend from terminal holes 51 toward a space within the case 50 that surrounds each of the terminal holes 51. The recesses 56 connect the space within the case to each of the terminal holes 51. When one of the external terminals 60 is inserted into one of the terminal holes 51 corresponding to one of the recesses 56, a portion of the leg 62 of the external terminal 60 is arranged in the recess 56. In plan view, a shape of the recess 56 conforms to the portion of the leg 62; and the recess 56 regulates a change in position of the external terminal 60.

As shown in FIG. 3, an end of the partition 55 in the Z2 direction is positioned in the Z1 direction apart from a bottom surface of the recess 56. In other words, a distance d, in the direction along the Z-axis, between the end of the partition 55 in the Z2 direction and the bonding surface 50*a* is greater than a depth of the recess 56. The depth of the recess 56 is approximately the same as the thickness of the leg 62 of the external terminal 60.

Figures 5, 6:
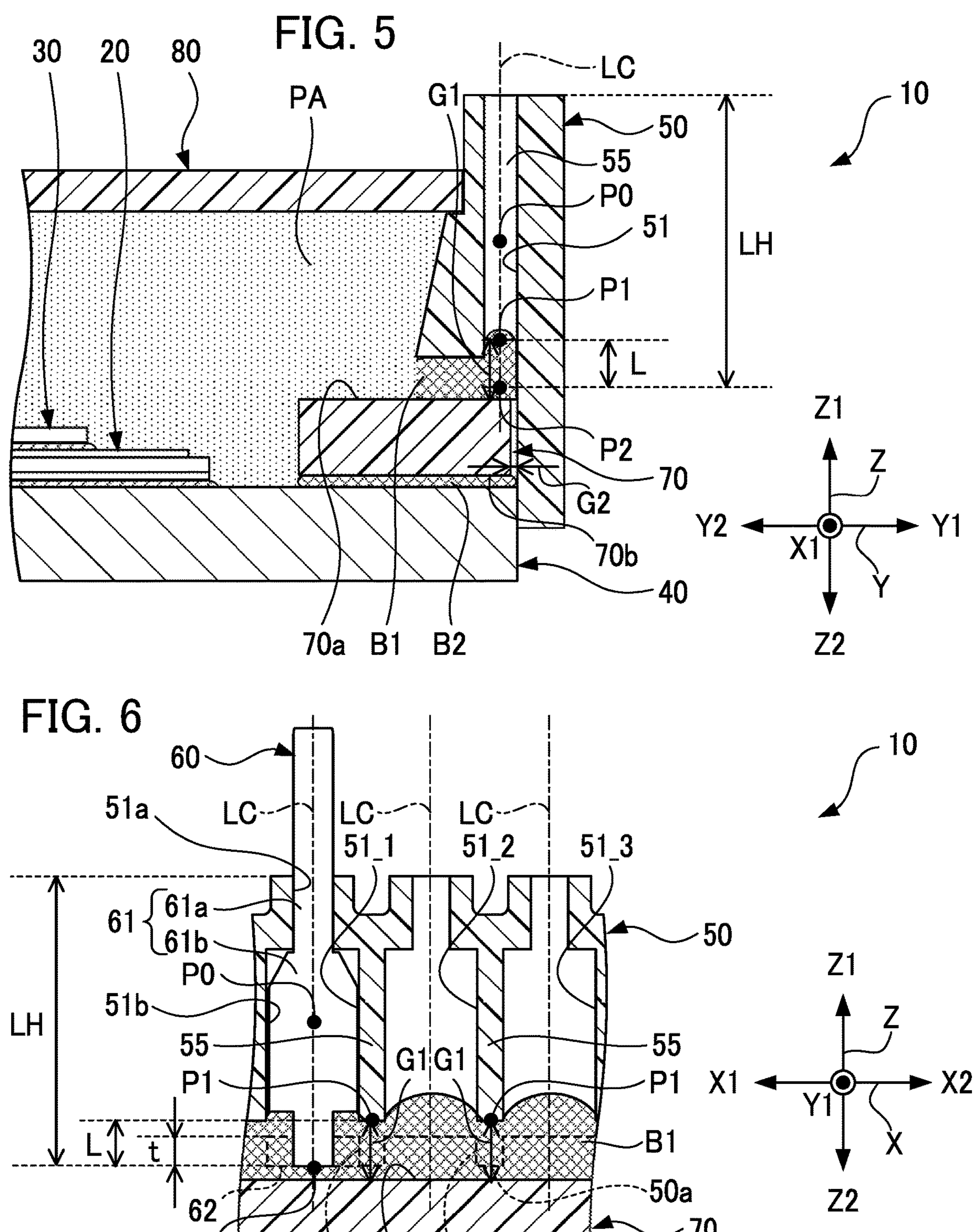
FIG. 5 is a cross section showing the semiconductor module taken along line B-B in FIG. 2.
FIG. 6 is a cross section showing the semiconductor module taken along line C-C in FIG. 2.

FIG. 4 is a cross section showing the semiconductor module 10 taken along line A-A in FIG. 2. FIG. 5 is a cross section showing the semiconductor module 10 taken along line B-B in FIG. 2. As shown in FIG. 4 and FIG. 5, the spacer 70 is interposed between the base 40 and the case 50.

The case 50 and the plurality of external terminals 60 are bonded to the bonding surface 70*a* of the spacer 70 by the adhesive B1. The base 40 is bonded to the bonding surface 70*b* of the spacer 70 by an adhesive B2.

The adhesive B1 not only bonds the case 50 and the spacer 70 to each other, but also seals each terminal hole 51. Therefore, it is possible to substantially prevent corrosive gas from entering the case 50 through the terminal holes 51 compared to a configuration in which the terminal holes 51 are not sealed by the adhesive B1. Specifically, as shown in FIG. 5, regarding the terminal hole 51 into which the external terminal 60 is not inserted, the adhesive B1 enters the terminal hole 51 to a point positioned in the Z1 direction apart from an end of the terminal hole 51 in the Z2 direction, thereby sealing the terminal hole 51. Although not shown, regarding the terminal hole 51 into which the external terminal 60 is inserted, the adhesive B1 seals a gap between an inner wall surface of the terminal hole 51 and an outer wall surface of the external terminal 60, thereby sealing the terminal hole 51.

The adhesive B1 is an insulating adhesive. More specifically, the adhesive B1 is an epoxy adhesive, an acrylic adhesive, a urethane adhesive, or a silicone adhesive, for example.

The type of the adhesive B2 is not particularly limited, and the adhesive B2 may be an epoxy adhesive, an acrylic adhesive, a urethane adhesive, or a silicone adhesive, for example. Adhesive B1 and adhesive B2 may be of the same type or of a different type. Although in the example shown in FIG. 4 the adhesive B1 and the adhesive B2 are separated from each other by the spacer 70, the present disclosure is not limited thereto. The adhesive B1 and the adhesive B2 may be contiguous. The adhesive B1 and the adhesive B2 each are not limited to a heat curing adhesive, and may be a light curing adhesive.

The adhesive B1 is preferably a heat curing adhesive. The heat curing adhesive has a property of temporarily softening under heating before being cured. By using a heat curing adhesive as the adhesive B1, an advantage is obtained in that the adhesive B1 for curing readily spreads to each of the terminal holes 51. Moreover, the heat curing adhesive can be cured at a desired timing. Thus, by using a heat curing adhesive as the adhesive B1, it is possible to prevent excessive spread of the adhesive B1.

The gas barrier property of the adhesive B1 is preferably higher than that of a potting material PA. Accordingly, when the semiconductor module 10 is used in a corrosive gas atmosphere, it is possible to substantially prevent corrosive gas entering the case 50 through the terminal holes 51 compared to a configuration in which the terminal holes 51 are sealed by the potting material PA. The "gas barrier property" is measured by a method in accordance with ISO 15106, for example. To enhance the gas barrier properties of the adhesive B1, an insulating inorganic filler such as an alumina material or a silica material, etc., may be included in the adhesive.

As shown in FIG. 4, the external terminal 60 inserted into the terminal hole 51 includes a bonding surface 60*a*, which is an example of a "first bonding surface." The bonding surface 60*a* is bonded to the bonding surface 70*a* of the spacer 70 by the adhesive B1. In the example shown in FIG. 4, the bonding surface 60*a* is a surface of the leg 62 of the external terminal 60, and the surface of the leg 62 faces in the Z2 direction.

A position P1 of the end of the partition 55 in the Z2 direction is positioned, in the Z1 direction, apart from a position P2 of the bonding surface 60*a* of the external terminal 60 in the Z2 direction. A distance between the position P1 and the position P2 in the direction along the Z-axis is defined as a distance L. The distance L between the bonding surface 60*a* and the partition 55 is greater than the thickness t of the external terminal 60. Therefore, a gap G1 with a size that corresponds to the distance L is provided between the partition 55 and the spacer 70.

The size of the gap G1 for the partition 55 that corresponds to the terminal hole 51 into which one of the plurality of external terminals 60 is not inserted is equal to or greater than the size of the gap G1 for the partition 55 that corresponds to the terminal hole 51 into which one of the plurality of external terminals 60 is inserted. In other words, a distance between the spacer 70 and the partition 55 that corresponds to the terminal hole 51 into which the one of the plurality of external terminals 60 is not inserted is equal to or greater than a distance between the spacer 70 and the partition 55 that corresponds to the terminal hole 51 into which the one of the plurality of external terminals 60 is inserted. Consequently, regardless of whether one or each of two adjacent terminal holes 51 has one of the plurality of external terminals 60 inserted therein, provision of the gap G1 enables the two terminal holes 51 to communicate with each other. Therefore, regardless of whether an external terminal 60 is present, the adhesive B1 for curing can flow from one of the two adjacent terminal holes 51 through the gap G1 to the other of the two adjacent terminal holes 51. As noted, the heat curing adhesive has a property of temporarily softening under heating before the heat curing adhesive is cured. Therefore, when the heat curing adhesive is used as the adhesive B1, the adhesive B1 for curing can flow appropriately from one of the two adjacent terminal holes 51 through the gap G1 to the other of the two adjacent terminal holes 51. Here, the term "equal" means not only "exactly equal" but also "substantially equal." Thus, cases in which differences that result from manufacturing errors are included.

The thickness t is the thickness of the leg 62 of the external terminal 60. The specific thickness t is not particularly limited. For example, the specific thickness t is approximately 1 mm.

A gap G2 between an inner peripheral surface of the case 50 and the outer peripheral surface of the spacer 70 is preferably kept as small as possible. With a decrease in a size of the gap G2, it is possible to decrease an amount of the adhesive B1 for curing and that flows along the inner peripheral surface of the case 50 in the direction toward the laminated substrate 11. Accordingly, it is possible to reduce both a lack of an amount of the adhesive B1 that is interposed between the external terminal 60 and the spacer 70, and a failure rate of a process carried out after a bonding process using the adhesive B1 due to a presence of air bubbles.

The distance L is shorter than half the length LH of the terminal hole 51. Therefore, the adhesive B1 can flow appropriately from one of the two adjacent terminal holes 51 through a vicinity of the partition 55 to the other of the two adjacent terminal holes 51. The length LH of the terminal hole 51 is a distance, in a direction along a central axis LC, between one opening edge of the terminal hole 51 and the other opening edge of the terminal hole 51.

The distance d, i.e., the difference (L−t) between the distance L and the thickness t, preferably satisfies a relationship of 0.5 mm≤(L−t)≤2.0 mm In this case, the adhesive B1 for curing can flow appropriately from one of the two adjacent terminal holes 51 through the gap G1 to the other of the two adjacent terminal holes 51. In contrast, when the difference (L−t) is too small, depending on a viscosity, etc., of the adhesive B1 for curing, the adhesive for curing may not readily flow from one of the two adjacent terminal holes 51 through the gap G1 to the other of the two adjacent terminal holes 51. On the other hand, when the difference (L−t) is too large, the amount of the adhesive B1 disposed in the gap G1 becomes excessive. Therefore, depending on an amount of the adhesive B1, the adhesive B1 for curing may not readily flow from one of the two adjacent terminal holes 51 through the gap G1 to the other of the two adjacent terminal holes 51. In addition, when the difference (L−t) is too large, it is difficult to reduce a size of the case 50 while maintaining a required strength of the case 50.

The depth of the recess 56 is approximately the same as the thickness t of the external terminal 60. Consequently, the bonding surface 60*a* is positioned generally on a same plane as the bonding surface 50*a*. Thus, the distance L can be referred to as a distance between the bonding surface 50*a* and the partition 55.

FIG. 6 is a cross section showing the semiconductor module 10 taken along line C-C in FIG. 2. In FIG. 6, terminal holes 51_1 to 51_3 are shown as three terminal holes 51. The terminal holes 51_1, 51_2, and 51_3 are arranged in the sequence as numbered. The terminal holes 51_1 and 51_2 are two adjacent terminal holes 51. Similarly, the terminal holes 51_2 and 51_3 are two adjacent terminal holes 51.

The terminal hole 51_1 is the terminal hole 51 into which the external terminal 60 is inserted. On the other hand, each of the terminal holes 51_2 and 51_3 is a terminal hole 51 into which the external terminal 60 is not inserted.

In the example shown in FIG. 6, the pin 61 of the external terminal 60 includes a first portion 61*a* and a second portion 61*b*. The first portion 61*a* is inserted into the first portion 51*a* of the terminal hole 51. The first portion 61*a* includes a portion protruding from the outer wall surface of the case 50. The second portion 61*b* is inserted into the second portion 51*b* of the terminal hole 51. The second portion 61*b* is positioned, in the Z2 direction, apart from the first portion 61*a*. The second portion 61*b* is connected to the leg 62. The width of the second portion 61*b* in a direction along the circumferential direction of the case 50 is greater than the width of the first portion 61*a* in the direction along the circumferential direction of the case 50. Thus, a shape of the pin 61 conforms to the shape of the terminal hole 51.

As shown in FIG. 6, each of the terminal holes 51_1 to 51_3 is sealed by the adhesive B1.

More specifically, the terminal hole 51_1 is sealed by the adhesive B1, which is applied so as to fill the gap between the wall surface of the terminal hole 51_1 and the external terminal 60. As described above, the distance L is greater than the thickness t. Consequently, the adhesive B1 for curing readily enters the gap. Therefore, reliability of sealing of the terminal hole 51_1 by the adhesive B1 can be enhanced.

Furthermore, each of the terminal holes 51_2 and 51_3 is sealed by the adhesive B1 entering each of the terminal holes 51_2 and 51_3 to a point positioned, in the Z1 direction, apart from the end of the partition 55 in the Z2 direction. As described above, the distance L is greater than the thickness t. Consequently, even if the amount of the adhesive B1 for curing varies between positions of the adhesive B1 for curing, the adhesive B1 for curing flows from one of the terminal holes 51_2 and the terminal hole 51_3 to the other thereby reducing an amount of variation. Therefore, reliability of sealing of the terminal holes 51_2 and 51_3 by the adhesive B1 can be enhanced.

1-3. Method of Manufacturing Semiconductor Module

Figure 7:
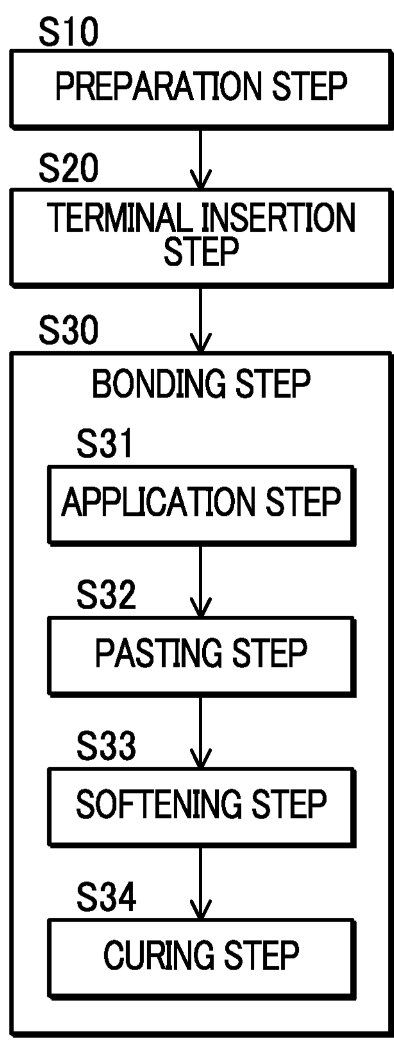
FIG. 7 is a flowchart showing a method of manufacturing the semiconductor module according to the first embodiment.

FIG. 7 is a flowchart showing a method of manufacturing the semiconductor module 10 according to the first embodiment. As shown in FIG. 7, the method of manufacturing the semiconductor module 10 includes a preparation step S10, a terminal insertion step S20, and a bonding step S30 in this sequence. The bonding step S30 includes an application step S31, a pasting step S32, a softening step S33, and a curing step S34 in this sequence. Each step will be described sequentially. Hereinafter, a case will be described in which a heat curing adhesive is used as the adhesive B1 described above.

1-3-1. Preparation Step

Figure 8:
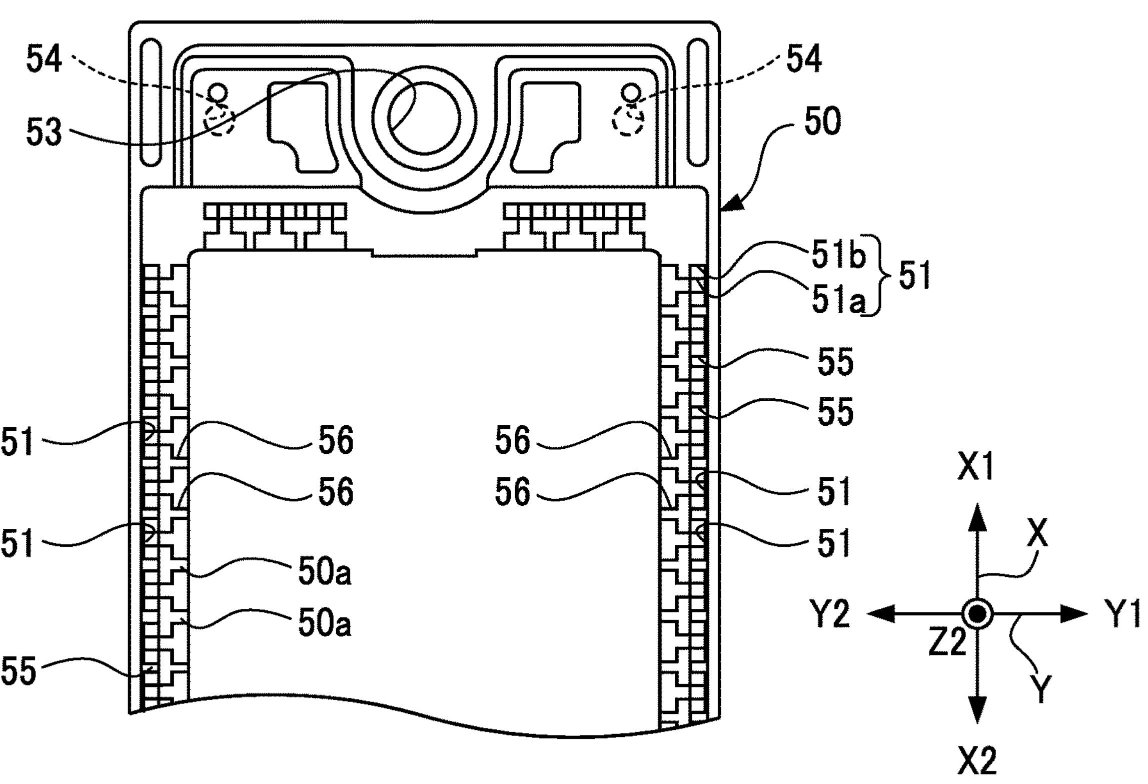
FIG. 8 is a diagram explaining a preparation step.

FIG. 8 is a diagram explaining the preparation step S10. FIG. 8 shows a portion of the case 50 as viewed in the Z1 direction. In the preparation step S10, as shown in FIG. 8, the case 50 is prepared. The case 50 is formed by injection molding, for example.

Although not shown, in the preparation step S10, in addition to the case 50, the plurality of external terminals 60 and the spacer 70 are prepared. Each external terminal 60 is formed by pressing and bending a metal plate, for example. The spacer 70 is formed by injection molding, for example.

1-3-2. Terminal Insertion Step

Figure 9:
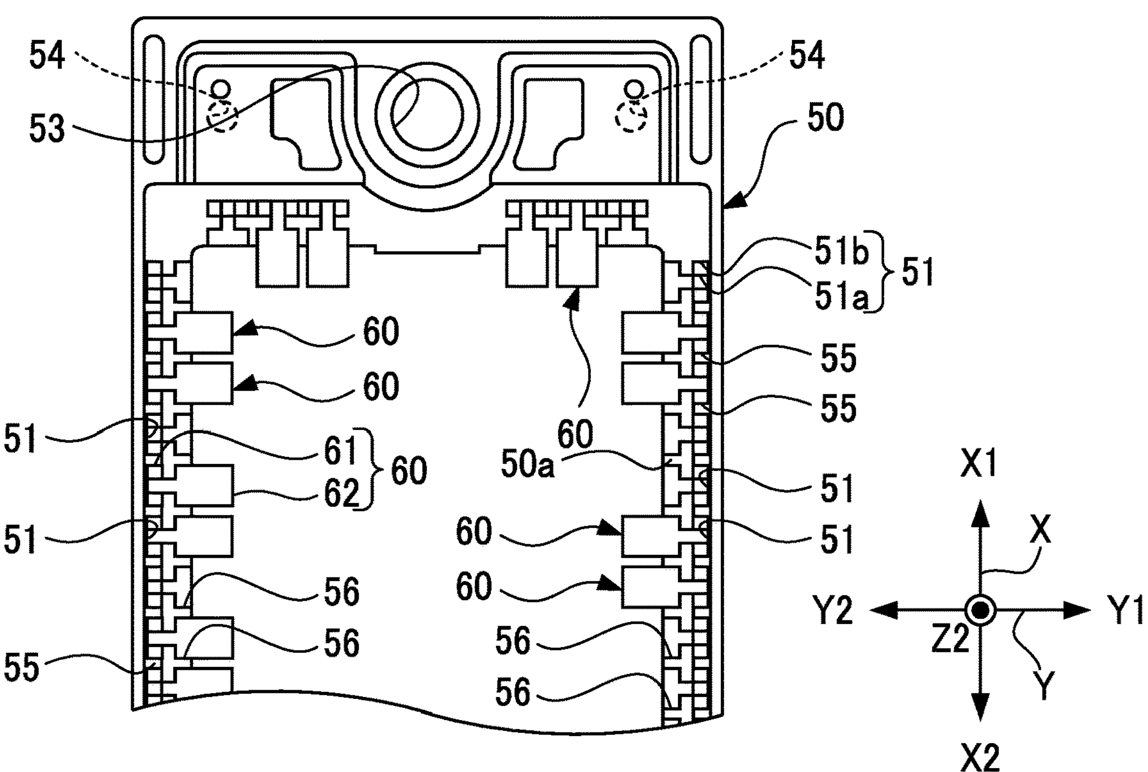
FIG. 9 is a diagram explaining a terminal insertion step.

FIG. 9 is a diagram explaining the terminal insertion step S20. FIG. 9 shows the portion of the case 50 as viewed in the Z1 direction. In the terminal insertion step S20, as shown in FIG. 9, each of the plurality of external terminals 60 is inserted into one of two or more terminal holes 51 from among the plurality of terminal holes 51 of the case 50, and each of the two or more terminal holes 51 is a terminal hole in to which one of the plurality of external terminals 60 is inserted. More specifically, the leg 62 of the external terminal 60 is disposed in the recess 56, and the pin 61 of the external terminal 60 is inserted into the terminal hole 51. At this time, the pin 61 may be fit to the terminal hole 51, and the leg 62 may be fit to the recess 56.

1-3-3. Bonding Step

In the bonding step S30, the application step S31, the pasting step S32, the softening step S33, and the curing step S34 are sequentially performed in the stated order, and the case 50 and the spacer 70 are bonded to each other by the adhesive B1.

1-3-3a. Application Step

Figure 10:
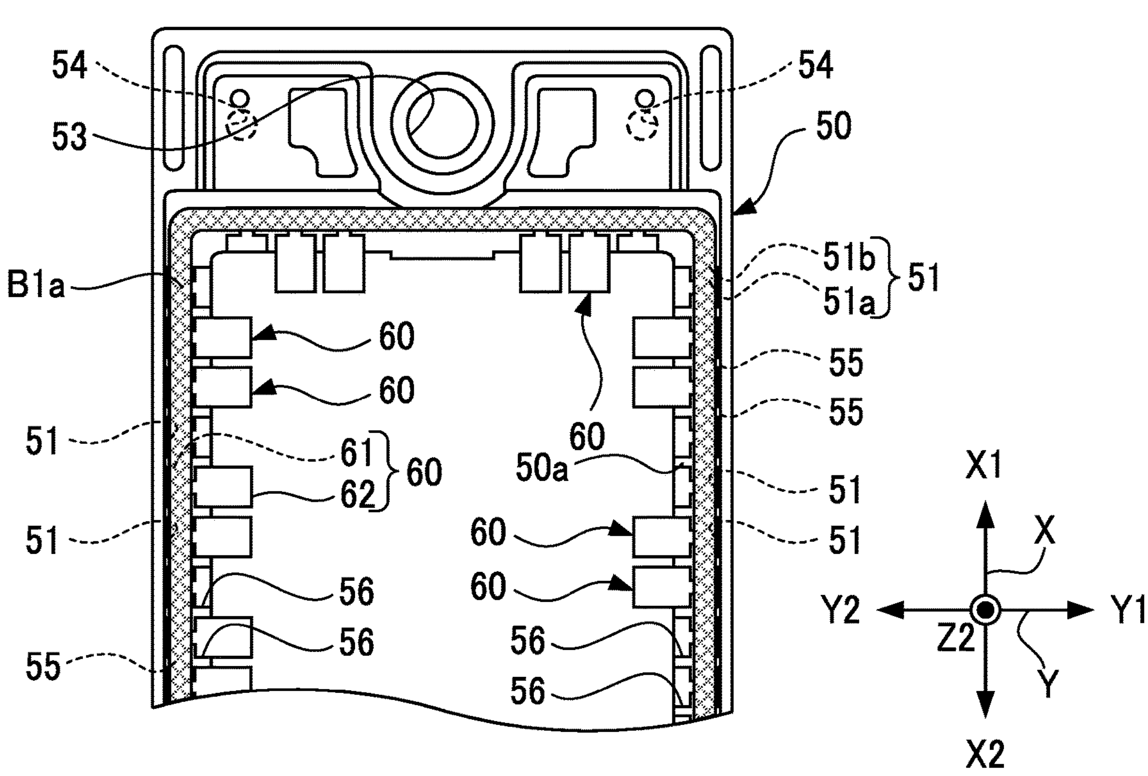
FIG. 10 is a diagram explaining an application step in a bonding step.

FIG. 10 is a diagram explaining the application step S31 in the bonding step S30. FIG. 10 shows the portion of the case 50 as viewed in the Z1 direction. In the application step S31, as shown in FIG. 10, an adhesive B1 a for curing is applied to the surface of the case 50 facing in the Z2 direction. More specifically, after the terminal insertion step S20, in a situation in which the Z2 direction is set as an upper direction in the vertical direction, the adhesive B1*a* for curing is applied to the surface of the case 50, which faces in the Z2 direction, along the circumferential direction of the case 50 over the entire circumference of the case 50. The adhesive B1*a* is applied to both the bonding surface 50*a* of the case 50 and the bonding surface 60*a* of the external terminal 60. The application of the adhesive B1*a* is performed by use of a dispenser, for example.

In the application step S31, the adhesive B1*a* may be applied to the bonding surface 70*a* of the spacer 70. In this case, the application of the adhesive B1 a to the bonding surface 50*a* of the case 50 may be omitted from the application step S31. An application area of the adhesive B1*a* in the application step S31 may be partly omitted in the circumferential direction of the case 50 or in the circumferential direction of the spacer 70 as long as the application area of the adhesive B1 a can spread over the entire circumference of the case 50 or over the entire circumference of the spacer 70 in the pasting step S32 described below.

1-3-3b. Pasting Step

Figure 11:
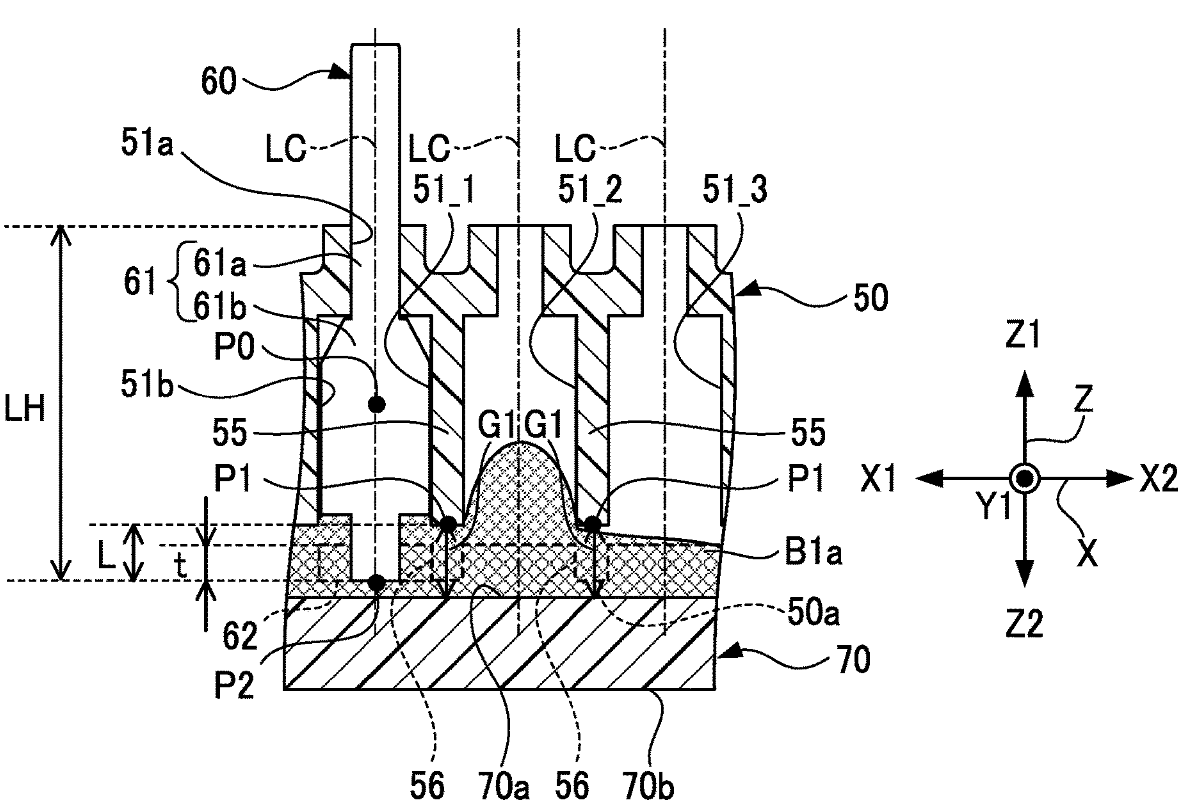
FIG. 11 is a diagram explaining a pasting step in the bonding step.

FIG. 11 is a diagram explaining the pasting step S32 in the bonding step S30. FIG. 11 shows a structure in which the case 50 and the spacer 70 are bonded to each other by the adhesive B1*a*, by using a cross section corresponding to that shown in FIG. 4. In the pasting step S32, after the application step S31, as shown in FIG. 11, the case 50 and the spacer 70 are bonded to each other by the adhesive B1*a*. The spacer 70 is inserted into the case 50 such that the bonding surface 50*a* of the case 50 and the bonding surface 70*a* of the spacer 70 face each other. By pressing the spacer 70 toward the case 50 the adhesive B1*a* is caused to spread.

In the pasting step S32, depending on a viscosity or temperature of the adhesive B1*a*, a thickness of the adhesive B1*a* may vary between application positions. In the example shown in FIG. 11, a thickness of the adhesive B1*a* in the terminal hole 51_2 is greater than that of the adhesive B1*a* in the terminal hole 51_3. As described above, the position P1 of the partition 55 is positioned, in the Z1 direction, apart from the bonding surface 50*a* of the case 50. Consequently, the adhesive B1 a readily spreads between the terminal hole 51_2 and the terminal hole 51_3. In particular, the position P1 of the partition 55 is positioned, in the Z1 direction, apart from the bonding surface 60*a* of the external terminal 60. Consequently, the adhesive B1*a* readily spreads between the terminal hole 51_1 and the terminal hole 51_2. Therefore, a variation in thickness of the adhesive B1*a* is reduced as compared to a conventional configuration in which the position P1 and the bonding surface 60*a* are on a common plane.

1-3-3c. Softening Step

Figure 12:
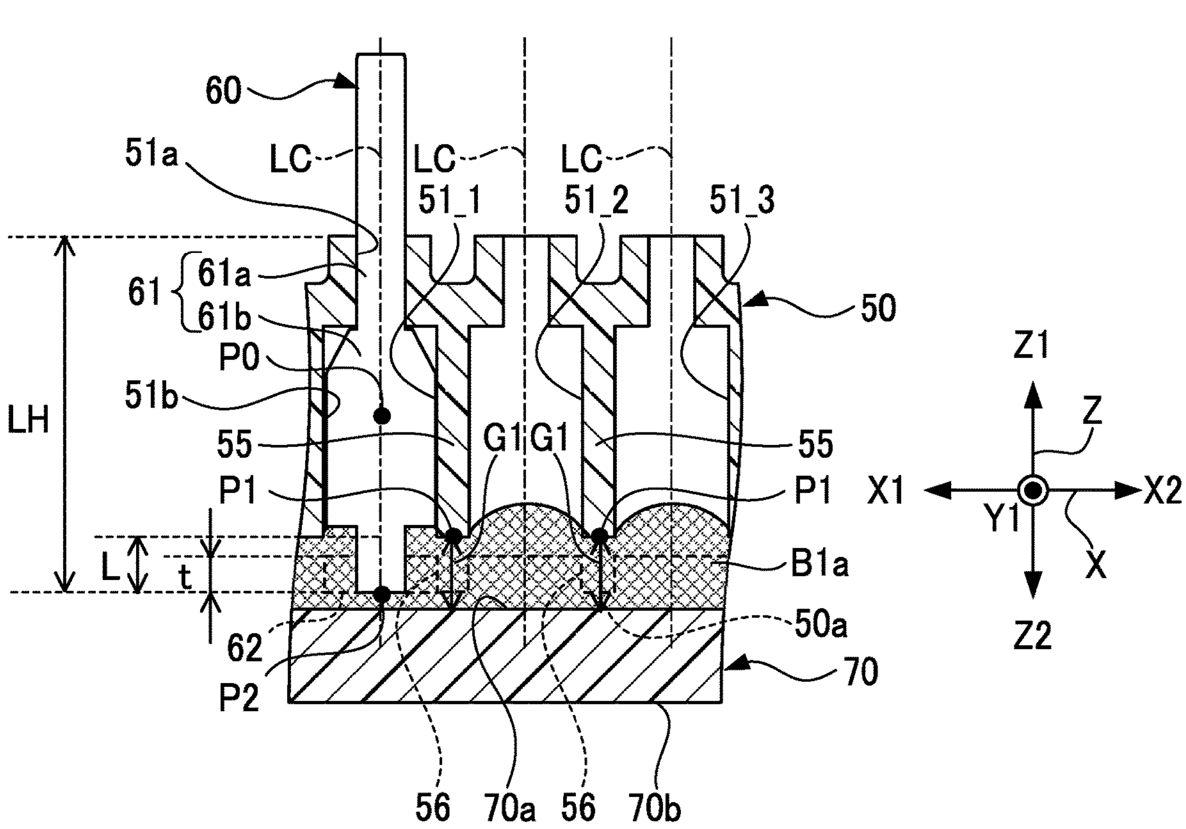
FIG. 12 is a diagram explaining a softening step in the bonding step.

FIG. 12 is a diagram explaining the softening step S33 in the bonding step S30. FIG. 12 shows a structure in which the case 50 and the spacer 70 are bonded to each other by the adhesive B1*a*, by using a cross section corresponding to that shown in FIG. 4. In the softening step S33, the adhesive B1*a* is softened and a variation in thickness of the adhesive B1*a* is further reduced as shown in FIG. 12. The adhesive B1*a* is heated to a temperature that is lower than a curing temperature by use of a heater or an oven, or the like, and the adhesive B1*a* is softened. A processing temperature and a processing time for the softening step S33 are determined in accordance with a type of adhesive B1*a*, etc. The processing temperature and the processing time are not particularly limited, and may be freely selected.

1-3-3d. Curing Step

In the curing step S34, after carrying out the softening step S33, the adhesive B1 a is further heated to cure the adhesive B1*a*. As a result, the adhesive B1 is formed as a cured product of the adhesive B1*a*. The curing step S34 may be performed after a predetermined elapse of time after completion of the softening step S33. Alternatively, the curing step S34 may be performed in continuation immediately after the softening step S33. When the curing step S34 is performed in continuation immediately after the softening step S33, the softening step S33 can be regarded as a part of the curing step S34. In other words, the softening step S33 may overlap the curing step S34.

Although not shown, after carrying out the curing step S34, the laminated substrate 11 is bonded to the spacer 70 by the adhesive B2. Thereafter, each of wires W is formed by wire bonding, etc., to electrically connect the external terminals 60 and the semiconductor elements 30 to each other. Thereafter, the potting material PA is filled in the case 50, and then the lid 80 is bonded to the case 50 by an adhesive, etc. Thus, the semiconductor module 10 is manufactured.

As described above, the method of manufacturing the semiconductor module 10 includes the preparation step S10, the terminal insertion step S20, and the bonding step S30. In the preparation step S10, the case 50 including the plurality of terminal holes 51 is prepared. In the terminal insertion step S20, each of the plurality of external terminals 60 is inserted into one of two or more terminal holes 51 from among the plurality of terminal holes 51 so that each of the two or more terminal holes 51 can be a terminal hole 51 into which one of the plurality of external terminals 60 is inserted. In the bonding step S30, the case 50 and the spacer 70 are bonded to each other by the adhesive B1.

Each of the plurality of external terminals 60 includes the bonding surface 60*a*, which is an example of the "first bonding surface." The bonding surface 60*a* is bonded to the spacer 70 by the adhesive B1. The case 50 includes, for each two adjacent terminal holes 51 among the plurality of terminal holes 51, the partition 55 provided between the two adjacent terminal holes 51. The distance L between the bonding surface 60*a* and the partition 55 is greater than the thickness t of each external terminal 60. In the bonding step S30, each terminal hole 51 is sealed by the adhesive B1.

As described above, the semiconductor module 10 includes the semiconductor element 30, the laminated substrate 11, the case 50, the plurality of external terminals 60, and the spacer 70. The laminated substrate 11 includes the circuit substrate 20 on which the semiconductor element 30 is mounted. The case 50 includes the plurality of terminal holes 51, and the case 50 houses the semiconductor element 30. Each of the plurality of external terminals 60 is inserted into one of two or more terminal holes 51 among the plurality of terminal holes 51, and each of the two or more terminal holes 51 is a terminal hole into which one of the plurality of external terminals 60, and the plurality of external terminals 60 are electrically connected to the semiconductor element 30. The spacer 70 is interposed between the laminated substrate 11 and the case 50. Included in the case unit 12 are the case 50, the plurality of external terminals 60, and the spacer 70.

As described above, the case 50 and the spacer 70 are bonded to each other by the adhesive B1. Each of the plurality of external terminals 60 includes the bonding surface 60*a*, which is an example of the "first bonding surface." The bonding surface 60*a* is bonded to the spacer 70 by the adhesive B1. The case 50 includes, for each two adjacent terminal holes 51 among the plurality of terminal holes 51, the partition 55 provided between the two adjacent terminal holes 51. The distance L between the partition 55 that corresponds to the two or more terminal holes 51 and the bonding surface 60*a* is greater than the thickness t of each of the plurality of external terminals 60. The distance (the size of a gap G1) between the spacer 70 and the partition 55 that corresponds to the terminal hole 51 other than the two or more terminal holes 51 among the plurality of terminal holes 51 is equal to or greater than the distance (the size of a gap G1) between the spacer 70 and the partition 55 that corresponds to the two or more terminal holes 51.

In the semiconductor module 10 described above, the distance L is greater than the thickness t, and the size of the gap G1 for the partition 55 that corresponds to the terminal hole 51 into which one of the plurality of external terminals 60 is not inserted is equal to or greater than the size of the gap G1 for the partition 55 that corresponds to the terminal hole 51 into which one of the plurality of external terminal 60 is inserted. Consequently, regardless of whether at least one of the two adjacent terminal holes 51 is a terminal hole into which one of the external terminals 60 is inserted, it is possible to form the gap G1 between the partition 55 and the spacer 70, which allows the two terminal holes 51 to communicate with each other. Therefore, when the spacer 70 and the case 50 are bonded to each other by the adhesive B1, the adhesive B1 for curing can flow appropriately from one of the two terminal holes 51 through the gap G1 to the other of the two terminal holes 51. Therefore, even if the amount of the adhesive B1 applied to the spacer 70 or to the case 50 varies between the application positions, it is possible to seal each of the two terminal holes 51 by the adhesive B1. Thus, all of the terminal holes 51 of the case 50 can be reliably sealed with the adhesive B1. As a result, even when the semiconductor module 10 is used in a corrosive gas atmosphere, it is possible to substantially prevent corrosive gas from entering the case 50 through the terminal holes 51. Thus, as will be understood from the above description, even when the semiconductor module 10 is used in a corrosive gas atmosphere, it is possible to reduce damage to the semiconductor module 10.

As described above, the case 50 is filled with the potting material PA covering the semiconductor element 30. The gas barrier property of the adhesive B1 is higher than that of a potting material PA. Therefore, even when the semiconductor module 10 is used in a corrosive gas atmosphere, it is possible to substantially prevent corrosive gas from entering the case 50 through the terminal holes 51 compared to a configuration in which the terminal holes 51 are sealed by the potting material PA.

Furthermore, as described above, each of the case 50 and the spacer 70 is frame-shaped. The plurality of terminal holes 51 is arranged along the circumferential direction of the case 50. The gap G2 between the inner peripheral surface of the case 50 and the outer peripheral surface of the spacer 70 is smaller than the gap G1 between the spacer 70 and the partition 55. Therefore, when the spacer 70 and the case 50 are bonded by the adhesive B1, it is possible to decrease an amount of the adhesive B1 that spreads along the inner peripheral surface of the case 50 in the direction toward the laminated substrate 11. As a result, the adhesive B1 can be appropriately spread along the circumferential direction of the spacer 70 by pressing the spacer 70 toward the case 50.

As described above, the partition 55 is closer to the spacer 70 than a center P0 of two adjacent terminal holes 51 between which the partition 55 is provided. In the longitudinal direction of the two adjacent terminal holes 51, the center P0 is a center of each of the two adjacent terminal holes 51. Therefore, the adhesive B1 can flow appropriately from one of the two adjacent terminal holes 51 to the other of the two adjacent terminal holes 51. In particular, as described above, the adhesive B1 can flow appropriately from one of the two adjacent terminal holes 51 through the gap G1 to the other of the two adjacent terminal holes 51 such that the relationship "$0.5 \leq (L-t) \leq 2.0$" is satisfied, where the distance between the partition 55 and the bonding surface 60*a* is L [mm], and the thickness of each of the plurality of external terminals 60 is t [mm].

Furthermore, as described above, each of the plurality of external terminals 60 includes the pin 61 and the leg 62. The pin 61 extends along any one of the two or more terminal holes 51. The leg 62 is interposed between the case 50 and the spacer 70, and the leg 62 is connected to the pin 61. The leg 62 includes the bonding surface 60*a*. Since the leg 62 is interposed between the case 50 and the spacer 70, the external terminal 60 can be stably supported by both the case 50 and the spacer 70. The portion of the leg 62 can be exposed in the case 50. As a result, the external terminal 60 and the semiconductor element 30 can be electrically connected to each other with ease.

As described above, since the adhesive B1 is a heat curing adhesive, the adhesive B1 for curing can flow appropriately from one of the two adjacent terminal holes 51 to the other of the two adjacent terminal holes 51 through the gap G1. In addition, it is possible to prevent excessive spread of the adhesive B1.

2. Second Embodiment

A second embodiment according to the present disclosure will now be described below. In the configuration described below, elements of relating to actions and functions that are the same as those in the embodiment described above will be denoted by the same reference signs used in the description of the embodiment described above, and detailed description thereof will be omitted as appropriate.

Figure 13:
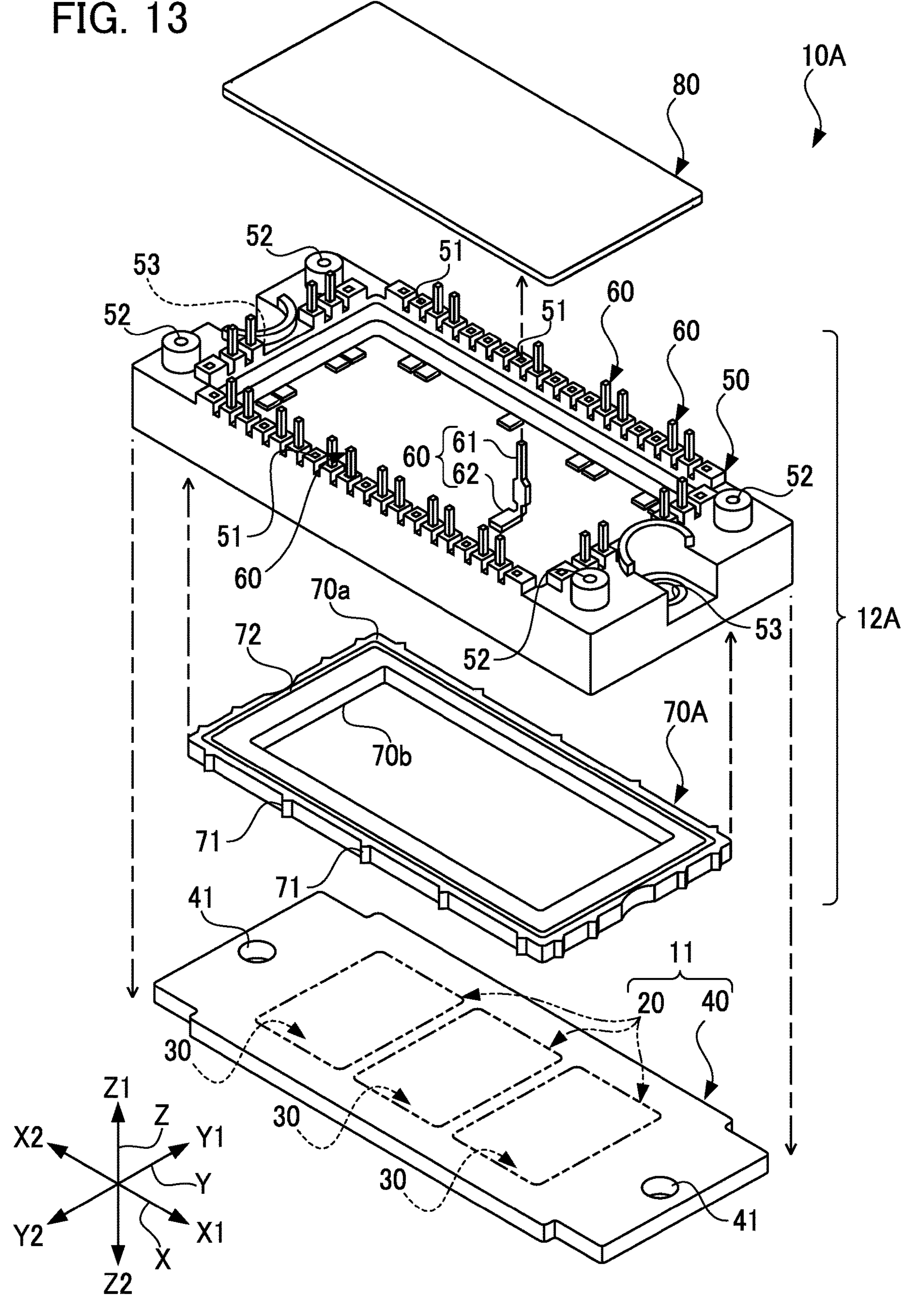
FIG. 13 is an exploded perspective view of a semiconductor module according to a second embodiment.

FIG. 13 is an exploded perspective view of a semiconductor module 10A according to the second embodiment. The semiconductor module 10A is configured in the same manner as the semiconductor module 10 according to the first embodiment, except for inclusion of a spacer 70A in place of the spacer 70. A case unit 12A includes the case 50, the plurality of external terminals 60, and the spacer 70A.

The spacer 70A is configured in the same manner as the spacer 70 except that it includes a recess 72. The recess 72 is a groove provided on an entire peripheral area of the bonding surface 70*a* in a circumferential direction of the bonding surface 70*a*. In the example shown in FIG. 13, the width of the recess 72 is constant. The recess 72 is shaped to extend along each side of the spacer 70.

The shape of the recess 72 is not limited to the example shown in FIG. 13. For example, the shape of the recess 72 may be one that has a plurality of portions of different widths. The shape of the recess 72 may also be one that has a meandering portion. The recess 72 may be partly omitted in the circumferential direction of the spacer 70A. For example, the recess 72 may be provided intermittently along the circumferential direction of the spacer 70A.

Figure 14:
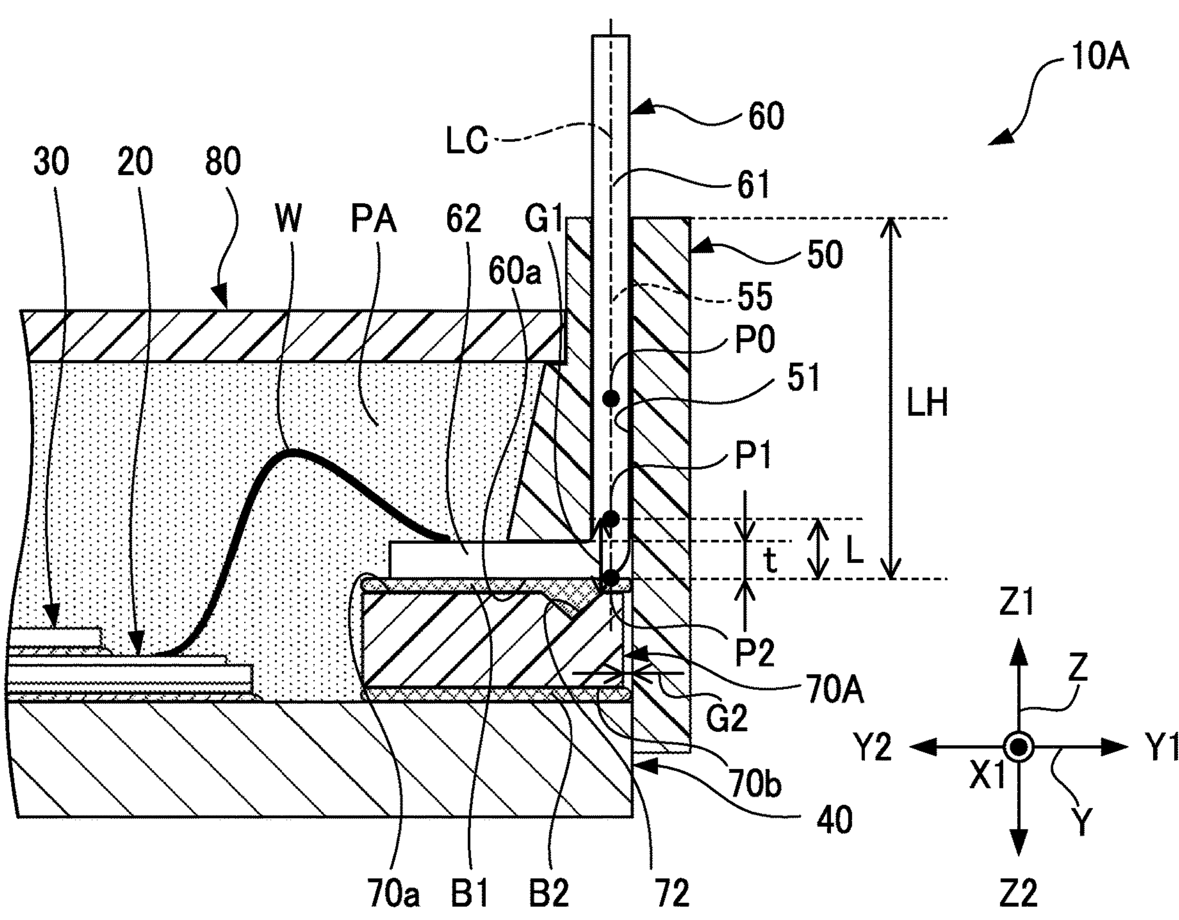
FIG. 14 is a cross section showing the semiconductor module according to the second embodiment.

FIG. 14 is a cross section showing the semiconductor module 10A according to the second embodiment. FIG. 14 shows the semiconductor module 10A using a cross section corresponding to FIG. 4 described above. As shown in FIG. 14, in plan view at least a portion of the recess 72 overlaps the bonding surface 60*a*. Therefore, the adhesive B1 for curing can spread along the bonding surface 60*a*. In plan view, at least a portion of the recess 72 overlaps the terminal hole 51. Therefore, the adhesive B1 for curing can flow from one of the two adjacent terminal holes 51 to the other of the two adjacent terminal holes 51.

In the example shown in FIG. 14, a cross-sectional shape of the recess 72 is V-shaped. The cross-sectional shape of the recess 72 is not limited to that shown in FIG. 14. For example, the cross-sectional shape of the recess 72 may be U-shaped or rectangular. The number of recesses 72 is not limited to one, and may be two or more.

According to the second embodiment, all of the terminal holes 51 of the case 50 can be reliably sealed by the adhesive B1. As a result, damage to the semiconductor module 10A can be minimized even when the semiconductor module 10A is used in a corrosive gas atmosphere. In this embodiment, as described above, the spacer 70 includes the bonding surface 70*a*, which is an example of a "second bonding surface." The bonding surface 70*a* is bonded to each of the plurality of external terminals 60 by the adhesive B1. The bonding surface 70*a* includes the recess 72 that extends along a direction in which the plurality of terminal holes 51 is arranged. Therefore, the adhesive B1 for curing can flow appropriately from one of the two adjacent terminal holes 51 to the other of the two adjacent terminal holes 51 through the recess 72.

3. Modifications

The present disclosure is not limited to the embodiments described above, and various modifications described below can be made thereto. In addition, each of the embodiments and each of the modifications may be combined with others as appropriate.

3-1. First Modification

In the embodiments described above, the application step S31 is performed before the pasting step S32. However, the present disclosure is not limited thereto. The application step S31 may be performed after the pasting step S32. For example, in a situation in which the adhesive B2 serves as the adhesive B1, when the base 40 and the spacer 70 are bonded to each other by the adhesive B2, the adhesive B2 for curing may enter a gap between the case 50 and the spacer 70 through a gap between the outer peripheral surface of the spacer 70 and the inner peripheral surface of the case 50.

DESCRIPTION OF REFERENCE SIGNS

10 . . . semiconductor module, 10A . . . semiconductor module, 11 . . . laminated substrate, 12 . . . case unit, 12A . . . case unit, 20 . . . circuit substrate, 30 . . . semiconductor element, 40 . . . base, 41 . . . mounting hole, 50 . . . case, 50*a* . . . bonding surface, 51 . . . terminal hole, 51_1 . . . terminal hole, 51_2 . . . terminal hole, 51_3 . . . terminal hole, 51*a* . . . first portion, 51*b* . . . second portion, 55 . . . partition, 56 . . . recess, 60 . . . external terminal,

60*a* . . . bonding surface (first bonding surface), 61 . . . pin, 61*a* . . . first portion, 1*b* . . . second portion, 62 . . . leg, 70 . . . spacer, 70A . . . spacer, 70*a* . . . bonding surface (second bonding surface), 70*b* . . . bonding surface, 71 . . . protrusion, 72 . . . recess, 80 . . . lid, B1 . . . adhesive, B1*a* . . . adhesive, B2 . . . adhesive, G1 . . . gap, G2 . . . gap, L . . . distance, LC . . . central axis, P . . . center, P0 . . . center, P1 . . . position, P2 . . . position, PA . . . potting material, S10 . . . preparation step, S20 . . . terminal insertion step, S30 . . . bonding step, S31 . . . application step, S32 . . . pasting step, S33 . . . softening step, S34 . . . curing step, W . . . wire, d . . . distance, t . . . thickness.

What is claimed is:

1. A semiconductor module comprising:

a semiconductor element;

a laminated substrate including a circuit substrate on which the semiconductor element is mounted;

a case including a plurality of terminal holes, the case housing the semiconductor element;

a plurality of external terminals, each external terminal being inserted into one of two or more terminal holes among the plurality of terminal holes, each of the two or more terminal holes being a terminal hole into which one of the plurality of external terminals is inserted, the plurality of external terminals being electrically connected to the semiconductor element; and a spacer interposed between the laminated substrate and the case, wherein:

the case and the spacer are bonded to each other by an adhesive, each external terminal includes a first bonding surface bonded to the spacer by the adhesive, the case includes, for each two adjacent terminal holes among the plurality of terminal holes, a partition between the two adjacent terminal holes, an end of the partition is in contact with the adhesive and faces the spacer, a distance between the first bonding surface and an end of a partition corresponding to the two or more terminal holes is greater than a thickness of each external terminal, the end of the partition corresponding to the two or more terminal holes being in contact with the adhesive and facing the spacer, and a distance between the spacer and an end of a partition corresponding to a terminal hole other than the two or more terminal holes is equal to or greater than a distance between the spacer and the partition corresponding to the two or more terminal holes, the terminal hole other than the two or more terminal holes being included in the plurality of terminal holes, the end of the partition corresponding to the terminal hole other than the two or more terminal holes being in contact with the adhesive and facing the spacer.

2. The semiconductor module according to claim 1, wherein each terminal hole of the plurality of terminal holes is sealed by the adhesive.

3. The semiconductor module according to claim 1, wherein:

the case is filled with a potting material covering the semiconductor element, and a gas barrier property of the adhesive is higher than a gas barrier property of the potting material.

4. The semiconductor module according to claim 1, wherein:

the spacer includes a second bonding surface bonded to each external terminal of the plurality of external terminals by the adhesive, and the second bonding surface includes a recess extending along a direction in which the plurality of terminal holes are arranged.

5. The semiconductor module according to claim 1, wherein the partition is closer to the spacer than a center of each of the two adjacent terminal holes in a longitudinal direction of the two adjacent terminal holes.

6. The semiconductor module according to claim 5, wherein a relationship of $0.5\ \text{mm} \le (L-t) \le 2.0\ \text{mm}$ is satisfied, where the distance between the partition and the first bonding surface is L [mm], and the thickness of each of the plurality of external terminals is t [mm].

7. The semiconductor module according to claim 1, wherein:

an external terminal among the plurality of external terminals includes:

a pin extending along any one of the two or more terminal holes; and a leg positioned between the case and the spacer, the leg being coupled to the pin, and the leg includes the first bonding surface.

8. The semiconductor module according to claim 1, wherein the adhesive is a heat curing adhesive.

9. A method of manufacturing a semiconductor module, the method comprising:

providing a semiconductor element;

providing a laminated substrate including a circuit substrate on which the semiconductor element is mounted;

preparing a case including a plurality of terminal holes, the case housing the semiconductor element;

inserting each external terminal of a plurality of external terminals into one of two or more terminal holes among the plurality of terminal holes, such that each terminal hole of the two or more terminal holes is a terminal hole into which an external terminal of the plurality of external terminals is inserted, the plurality of external terminals being electrically connected to the semiconductor element;

providing a spacer interposed between the laminated substrate and the case; and bonding the case and the spacer to each other with an adhesive, wherein:

each external terminal includes a bonding surface bonded to the spacer by the adhesive, the case includes partitions, such that for each of two adjacent terminal holes among the plurality of terminal holes, a partition among the partitions is provided between the two adjacent terminal holes, an end of the partition is in contact with the adhesive and faces the spacer, a distance between the bonding surface and an end of a partition corresponding to the two or more terminal holes is greater than a thickness of each external terminal, the end of the partition corresponding to the two or more terminal holes being in contact with the adhesive and facing the spacer, a distance between the spacer and an end of a partition corresponding to a terminal hole other than the two or more terminal holes is equal to or greater than a distance between the spacer and the partition corresponding to the two or more terminal holes, the terminal hole other than the two or more terminal holes being included in the plurality of terminal holes, the end of the partition corresponding to the terminal hole other than the two or more terminal holes being in contact with the adhesive and facing the spacer, and the bonding the case and the spacer includes sealing each terminal hole of the plurality of terminal holes with the adhesive.

10. A semiconductor module comprising:

a semiconductor element;

a laminated substrate including a circuit substrate on which the semiconductor element is mounted;

a case including a plurality of terminal holes, the case housing the semiconductor element;

a plurality of external terminals, each external terminal among the plurality of external terminals being inserted into one of two or more terminal holes among the plurality of terminal holes, such that each terminal hole of the two or more terminal holes is a terminal hole into which an external terminal of the plurality of external terminals is inserted, the plurality of external terminals being electrically connected to the semiconductor element; and a spacer interposed between the laminated substrate and the case; wherein:

the spacer is bonded to the case by an adhesive;

each external terminal among the plurality of external terminals includes a bonding surface bonded to the spacer by the adhesive, the case includes partitions, such that for each of two adjacent terminal holes among the plurality of terminal holes, a partition among the partitions is provided between the two adjacent terminal holes, an end of the partition is in contact with the adhesive and faces the spacer, a distance between the bonding surface and an end of a partition corresponding to the two or more terminal holes is greater than a thickness of each external terminal, the end of the partition corresponding to the two or more terminal holes being in contact with the adhesive and facing the spacer, a distance between the spacer and an end of a partition corresponding to a terminal hole other than the two or more terminal holes is equal to or greater than a distance between the spacer and the partition corresponding to the two or more terminal holes, the terminal hole other than the two or more terminal holes being included in the plurality of terminal holes, the end of the partition corresponding to the terminal hole other than the two or more terminal holes being in contact with the adhesive and facing the spacer, and each terminal hole of the plurality of terminal holes is sealed by the adhesive.

* * * * *